United States Patent
Vanderberg (12)

(10) Patent No.: US 6,452,196 B1
(45) Date of Patent: Sep. 17, 2002

(54) POWER SUPPLY HARDENING FOR ION BEAM SYSTEMS

(75) Inventor: Bo H. Vanderberg, Boston, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/467,700

(22) Filed: Dec. 20, 1999

(51) Int. Cl.$^7$ .......................... H01J 37/30; H02M 3/335
(52) U.S. Cl. ..................... 250/492.21; 363/21
(58) Field of Search ......................... 250/492.2, 492.21; 362/21, 19

(56) References Cited

U.S. PATENT DOCUMENTS

| | | | | |
|---|---|---|---|---|
| 3,748,536 A | * | 7/1973 | Andresen | 219/121.15 |
| 4,295,188 A | * | 10/1981 | Brunssen | 363/19 |
| 5,608,223 A | | 3/1997 | Hirokawa et al. | |
| 5,621,305 A | * | 4/1997 | Clark et al. | 307/102 |
| 5,661,308 A | | 8/1997 | Benveniste et al. | |
| 5,811,823 A | | 9/1998 | Blake et al. | |
| 5,820,366 A | | 10/1998 | Lee | |
| 5,892,235 A | * | 4/1999 | Yamazaki et al. | 250/398 |
| 5,900,177 A | | 5/1999 | Lecouras et al. | |
| 5,946,259 A | * | 8/1999 | Manning et al. | 365/149 |
| 6,127,743 A | * | 10/2000 | Levin et al. | 307/105 |
| 6,305,316 B1 | * | 10/2001 | DiVergilio et al. | 118/723 AN |

FOREIGN PATENT DOCUMENTS

| | | | |
|---|---|---|---|
| EP | 0 550 054 A1 | * | 7/1993 |
| EP | 08064166 | * | 8/1996 |

OTHER PUBLICATIONS

European Search Report, Application No. 00311254.7–2208, dated May 18, 2001, three pages, including an Abstract/Zusammenfassung/Aberege, No. 00311254.7, one page.

"Electron Tube", The Columbia Encyclopedia, Fifth Edition Copyright ©1993, Columbia University Press, reprinted from the internet at http://www.infoplease.com/ce5/CE016557.html, 2 pages.

ION Plantation for VLSI, Silicon Processing for the VLSI Era, pp. 282–327.

* cited by examiner

Primary Examiner—Jack Berman
Assistant Examiner—Johnnie L Smith
(74) Attorney, Agent, or Firm—Eschweiler & Associates, LLC

(57) ABSTRACT

An improved ion implantation system is provided by the present invention. The system includes at least one power supply for providing voltage to at least one electrode and, a switching system operatively coupled between the at least one power supply and the at least one electrode. The switching system decouples the at least one power supply and the at least one electrode at a predetermined threshold to mitigate overload of the at least one power supply.

22 Claims, 8 Drawing Sheets

POWER SUPPLY HARDENING FOR ION BEAM SYSTEMS

FIELD OF THE INVENTION

The present invention generally relates to ion beam systems, and in particular to a system and method for providing improved ion beam performance by mitigating power supply overload conditions.

BACKGROUND OF THE INVENTION

Ion implantation is an important aspect of very large scale integration (VLSI) fabrication. Ion implantation is a process in which energetized, charged atoms or molecules are directly introduced into a semiconductor substrate. In VLSI fabrication, ion implantation is primarily employed to add dopant ions into the surface of silicon wafers. An objective of the ion implantation process is to introduce a desired atomic species into a target material. In order to meet this objective effectively, several aspects of the ion implantation process need to be controlled. First, the implant species should be implemented in the exact quantity specified. Additionally, the implanted species should be located at desired depths below the substrate surface and should be limited to only predetermined areas of the substrate. When required, it should be possible to electrically activate substantially all implanted impurities, and as much as possible, the silicon lattice structure should remain unchanged by the dopant incorporation process. Thus, ion implantation systems are needed that can accurately implant and monitor quantity and location of the implant species being implemented.

Conventional ion implantation systems include an ion source that ionizes a desired dopant element which is then accelerated to form an ion beam of prescribed energy. This beam is directed to the surface of a workpiece. Generally, the energetic ions of the ion beam penetrate into the bulk of the workpiece and are embedded into the crystalline lattice of the material to form a region of desired conductivity. The ion implantation process is generally performed in a high vacuum, gas-tight process chamber which encases a wafer handling assembly and the ion source.

A typical ion beam path in prior art implantation systems includes an ion source, electrodes, an analyzing magnet arrangement, an optical resolving element, and a wafer processing system. The electrodes extract and accelerate ions generated in the ion source to produce a beam directed toward the analyzing magnet arrangement. The analyzing magnet arrangement sorts the ions in the ion beam according to their charge-to-mass ratio, and the wafer processing system adjusts the position of the workpiece relative to the ion beam path. The optical resolving element enables the system to focus ions having a selected charge-to-mass ratio, in conjunction with the analyzing magnet arrangement, so that ions are directed toward the workpiece.

Ion implantation systems generally provide high voltages to produce acceleration energies necessary to implant the ions into a substrate. Acceleration energies may range from 10–200 keV in many implantation systems to energies as high as several MeV in high-energy systems. Generally, such high voltages are applied via electrodes supplied by high voltage power supplies.

Often times, in conventional ion implantation systems, transient electric discharges may occur at electric field stress points, or discharges may be induced by particles or process deposits on electrodes and/or insulators. These discharges contribute to varying of electrode voltages, thereby affecting optics of the implantation system with potential loss of the ion beam. Consequently, the variation of electrode voltage may cause overloading and/or voltage collapse of power supply circuitry. Valuable ion beam implantation time may be lost during periods when power supplies are in an overload and/or voltage collapse condition. The duration of such periods is generally governed by the amount of time required for the power supplies to recover from the overload and/or voltage collapse.

In view of the above problems associated with ion beam loss in conventional ion implantation systems with regard to power supply overload from transient discharges, it would therefore be desirable to have a system and method which by mitigates such power supply overload and/or voltage collapse conditions.

SUMMARY OF THE INVENTION

The present invention provides a system and method for shortening ion beam loss times by hardening power supplies in ion implantation systems. Hardening is effectively accomplished by insulating the power supplies from electrode discharges associated therewith. As electrodes discharge during an implantation process, vacuum discharges associated therewith are quenched, and loss of energy stored in power supplies typically associated with such discharges is mitigated. Thus, the present invention significantly reduces the time required to recover electrode voltage and the associated ion beam.

More particularly, the present invention provides power supply hardening by insulating power supplies from transient discharges via a transient isolation system. The transient isolation system is operatively coupled between the power supplies and associated electrodes and/or other elements subject to discharge. The transient isolation system of the present invention serves to temporarily insulate power supplies from electrode circuits during transient discharges associated with the electrodes. Without transient isolation, discharges generally cause electrode power supply to be discharged such that electrode voltages drop to a low value, thereby causing the power supplies to operate in an overload (e.g, over-current, under-voltage) condition while feeding the discharge. It has been observed that ion beam losses may last for several tens of milliseconds while power supplies recover from an overload condition. By isolating the power supplies, the present invention enables power supply current and voltage to remain at acceptable levels even during a discharge situation. Since the power supplies are isolated during transient discharge conditions, discharges are substantially only fed by stray capacitance associated with the electrodes during a few microseconds, and thus substantially quenched by lack of sufficient power from the isolated power supplies.

According to one aspect of the present invention, an ion implantation system is provided. The system includes at least one power supply for providing voltage to at least one electrode and a switching system operatively coupled between the at least one power supply and the at least one electrode. The switching system decouples the at least one power supply and the at least one electrode at a predetermined threshold to mitigate overload of the at least one power supply.

According to another aspect of the present invention, an ion implantation system is provided. The system includes an ion source for providing ions to form an ion beam, and at least one power supply for providing voltage to at least one electrode for directing the ion beam to a workpiece. The system includes a transient isolation system for providing a substantially uninterrupted ion beam to the workpiece. The transient isolation system insulates the at least one power supply from discharges by the at least one electrode.

According to yet another aspect of the present invention, an ion implantation system is provided. The system includes a voltage source for providing voltage to at least one electrode, and a means for decoupling the voltage source and the at least one electrode at a predetermined threshold to mitigate overload of the voltage source.

According to still yet another aspect of the present invention, a methodology for power supply hardening in an ion implantation system is provided. The methodology includes the steps of: monitoring current from at least one power supply which powers at least one electrode; determining if the current is below a predetermined threshold; and insulating the at least one power supply from the at least one electrode if the current is above the predetermined threshold.

According to still yet another aspect of the present invention, a methodology for power supply hardening in an ion implantation system is provided. The methodology includes the steps of: monitoring voltage from at least one power supply which powers at least one electrode; determining if the voltage is below a predetermined threshold; and insulating the at least one power supply from the at least one electrode if the voltage is above the predetermined threshold.

To the accomplishment of the foregoing and related ends, the invention, then, comprises the features hereinafter fully described. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
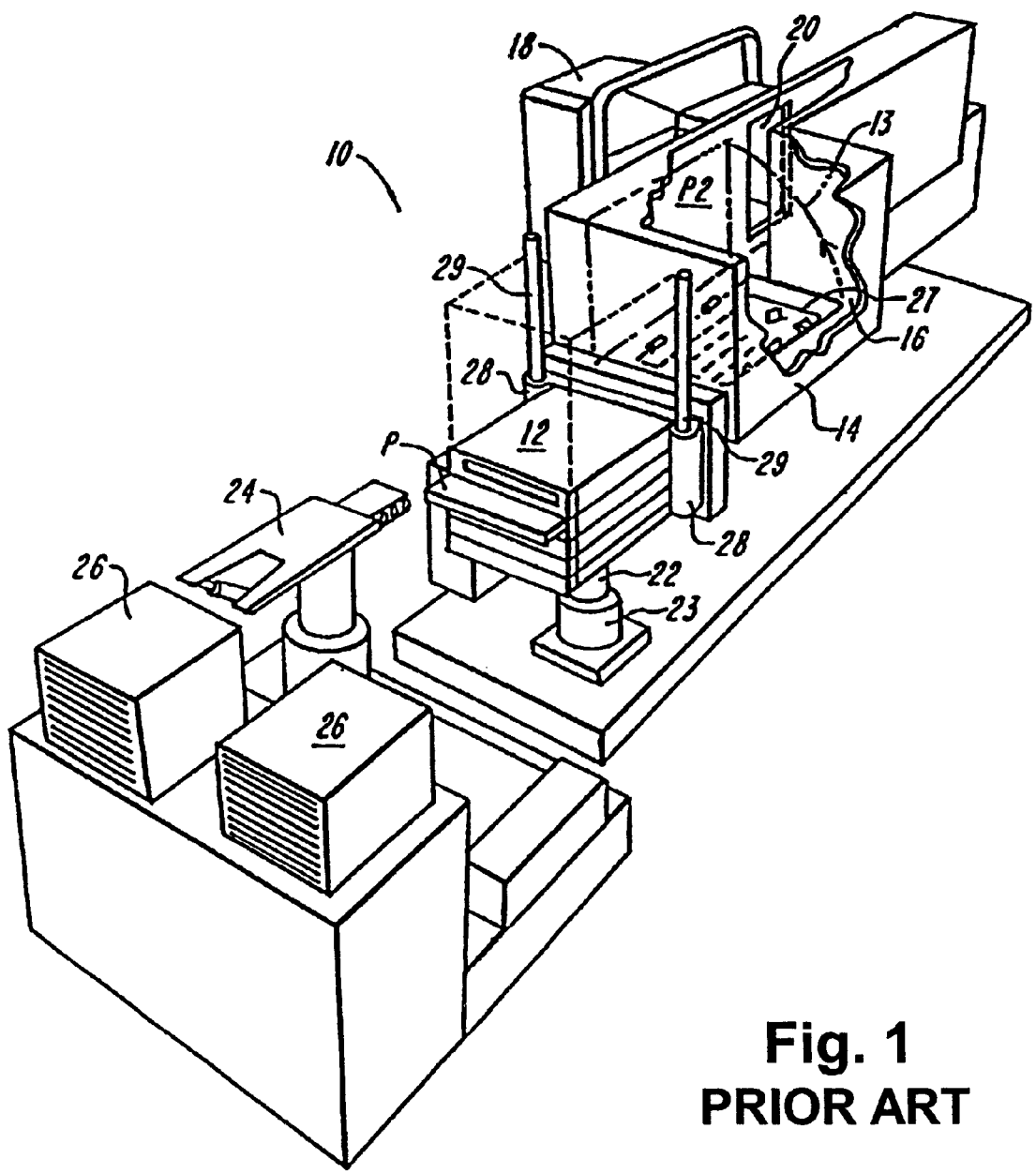
FIG. 1 is a diagram of an ion implantation system in accordance with the present invention.

The present invention will now be described with reference to the drawings, wherein like reference numerals are used to refer to like elements throughout.

The present invention relates to a system and method for substantially improving ion beam performance in an ion implantation system. In particular, ion beam performance is improved by mitigating power supply overload conditions during transient discharges from ion accelerating electrodes. By mitigating overload conditions, ion beam loss during the implantation process is substantially reduced.

Referring initially to FIG. 1, an ion beam implantation system 10 is shown in accordance with the present invention. The ion implantation system 10 includes a pair of panel cassettes 26, an end effector 24, a loadlock assembly 12, a housing 14 which defines a process chamber 16, and an ion source 18, which communicates with the process chamber 16 through beam aperture 20. As will be described in more detail below, the ion source 18 in conjunction with the aperture 20 forms an ion beam (not shown). The ion source 18 includes a transient isolation system 30 (FIG. 2) for mitigating power supply overload conditions and substantially reducing ion beam losses. The end effector 24 transfers the panel P stacked in the cassette 26 to the loadlock assembly 12. A conventional motor assembly 23, a lead screw 22, a pair of linear bearings 28, and circular shafts 29 are provided to transfer the panel P from the loadlock assembly 12 to the process chamber 16 as is well known in the art. A pickup arm 27 handles the panel P during processing. When the pickup arm 27 initially removes the panel P from the loadlock assembly 12, it is oriented in a substantially horizontal position P1. The pickup arm then vertically directs the panel, as denoted by arrow 13, into a substantially vertical position P2. The pickup arm 27 and the panel P (oriented in position P2), are moved, as is well known in the art, in a scanning direction, from left to right in the illustrated embodiment, across the path of an ion beam emerging from aperture 20, and which is generated by the ion source 18.

Figure 2:
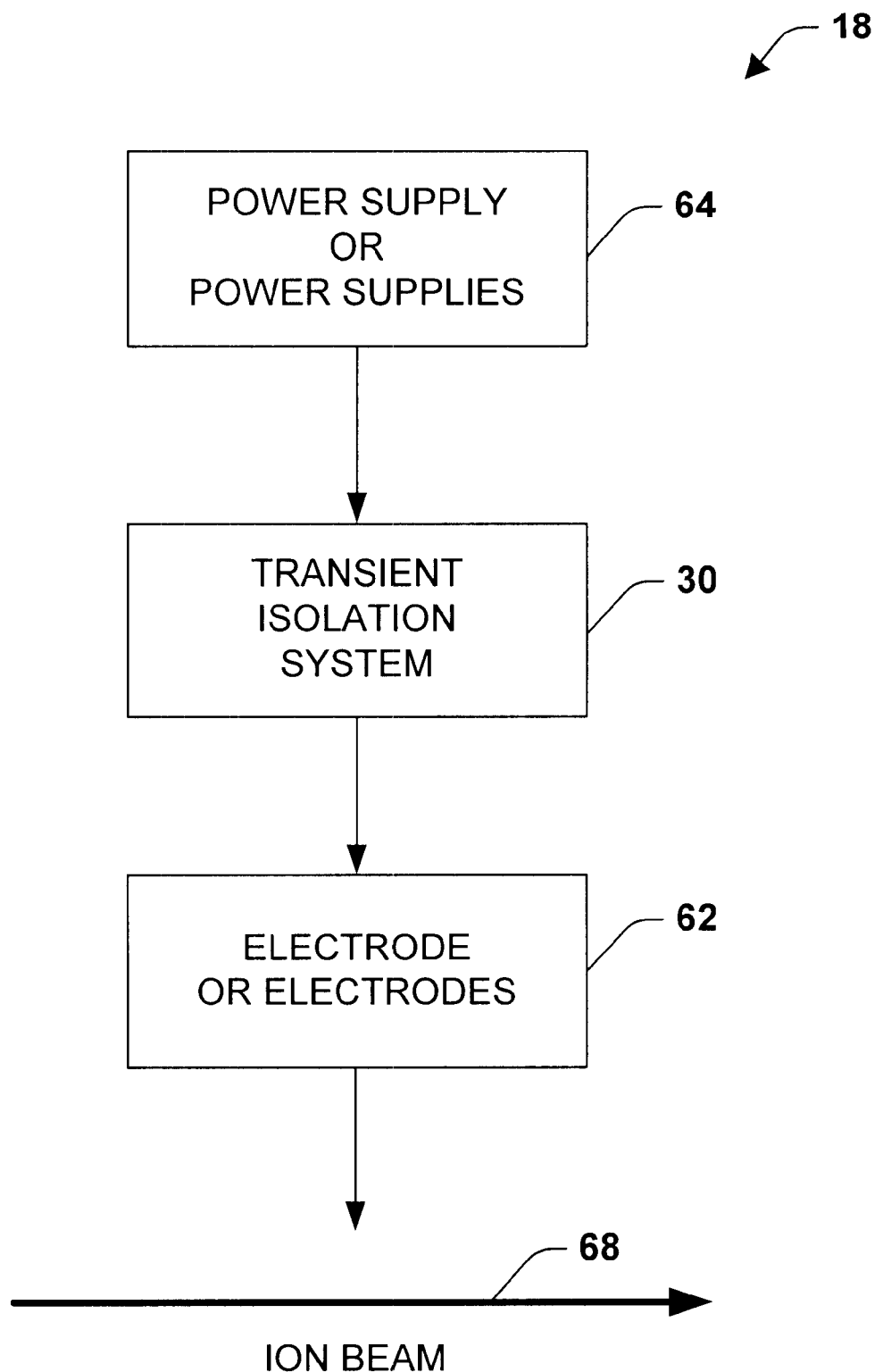
FIG. 2 is a block diagram of a transient isolation system in accordance with the present invention.

Now referring to FIG. 2, portions of the ion source 18 are shown in more detail in accordance with the present invention. The ion source 18 includes accelerating electrodes 62 and power supplies 64 for directing an ion beam 68. Also, the transient isolation system 30 is included for providing insulation between the electrodes 62 and power supplies 64 during transient discharge conditions.

In order to direct the ion beam 68, generally, the power supplies 64 provide electrodes 62 with voltages to produce ion acceleration energies necessary for ion implantation. As will be described in more detail below, the electrodes 62 may include a plasma electrode for directing ions from an ion chamber (not shown), and an extraction, a suppression, and a ground electrode for accelerating the ejected ions. The power supplies 64 provide bias voltages for the electrodes 62. For example, the ground electrode is generally biased at 0 V, the suppression electrode may be biased at about −3 kV, the extraction electrode may be biased at about 90 kV, and the plasma electrode may be biased at about 95 kV. Since relatively high voltages are involved in the process, arcing may occur between electrodes and/or between electrodes and ground.

It has been found that arcing may cause short (time period) current surges from the electrodes 62, and subsequently may cause the power supplies 64 to collapse (e.g., low voltage, over-current condition). For example, a power supply may be in an over-current condition if the supply current is exceeded by about 30% of nominal supply current. The voltage collapse may require several tens of milliseconds for the power supplies 64 to recover (e.g., return to nominal output voltage). Consequently, the ion beam 68 may be lost during this power supply recovery time. It has been found that the beam 68 maybe lost as long as the power supplies are not within about 98.5% of nominal output voltage.

The transient isolation system(TIS) 30 mitigates collapsing of the power supplies 64 by insulating (e.g., isolating, blocking) transient discharges associated with the electrodes 62. The TIS 30 temporarily disassociates the electrodes 62 from the power supplies 64 during transient discharge (e.g., arcing) conditions. Although the TIS 30 is shown as a separate system in the preferred embodiment, it is to be appreciated that the TIS 30 may be included within the power supplies 64 and/or provided with the electrodes 62.

It has been found that discharges are likely initiated on an electrode 62 and eventually develop into an arc. The arc may short circuit the electrodes 62 so that stray capacitance between the electrodes 62 and ground is discharged through the arc, causing voltage collapse of the electrodes 62 and associated power supply 64. The arc generally causes a short-time period, high current surge from the power supply 64 lasting about 0.5 to 1 microseconds. Without the TIS 30, the current surge may cause the power supply 64 to collapse for several milliseconds because of an over-current/under-voltage shut down condition. With the TIS 30 in place, the power supply 64 is isolated via transient blocking circuits 30a, 30b, and 360 (FIGS. 4a, 4b, and 6b) within the TIS 30. The transient blocking circuits 30a, 30b, and 360 may include passive and/or active circuits. When the transients are blocked, the discharge is limited to the stray capacitance discharge of the electrodes 62. Thus, millisecond power supply overload shutdowns are reduced to microsecond stray capacitance discharges of the electrodes 62. This represents about a 10 times improvement over prior art ion implantation systems.

Figure 3:
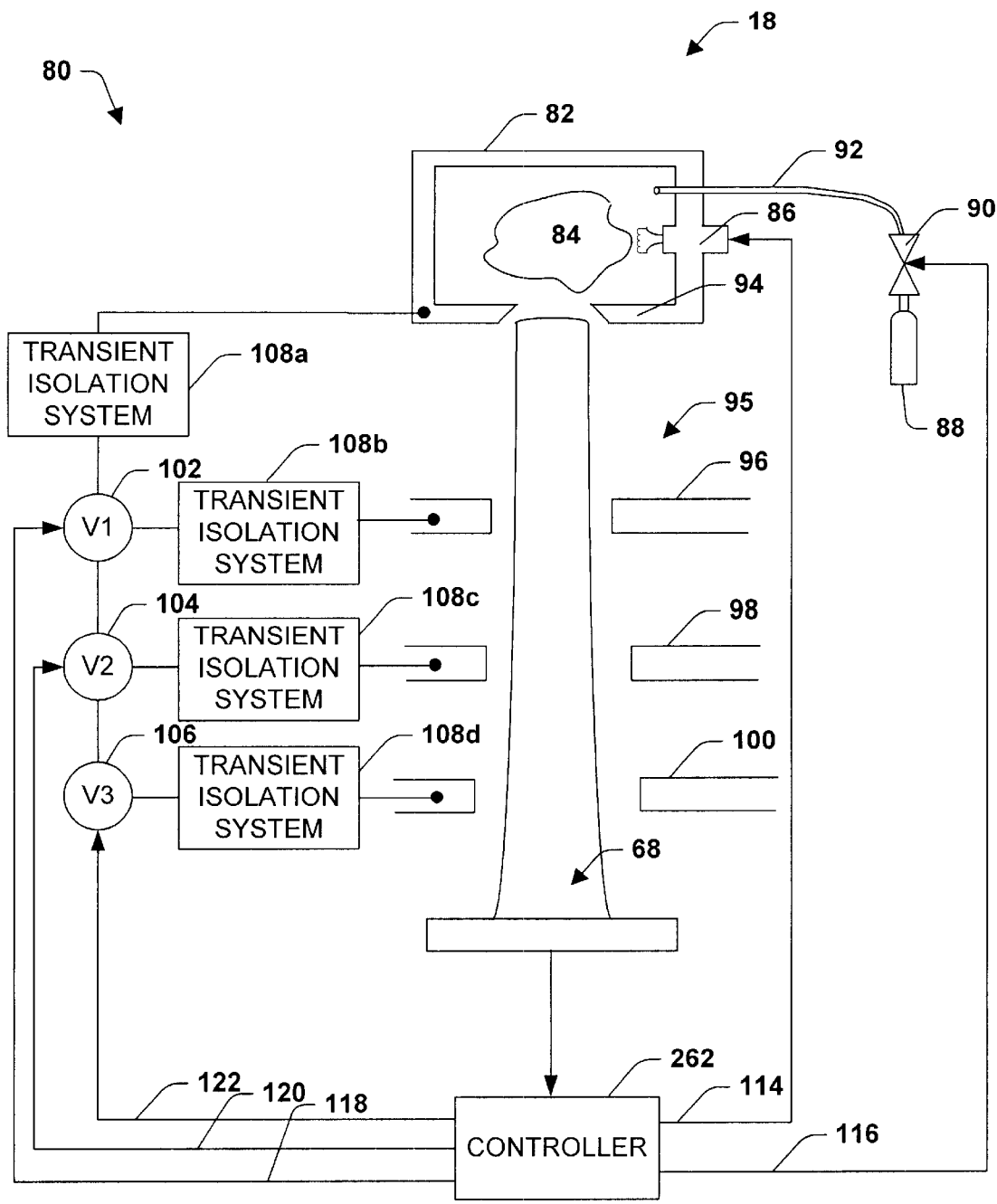
FIG. 3 is a detailed schematic block diagram of a transient isolation system in connection with an ion source in accordance with the present invention.

Turning now to FIG. 3, a detailed schematic block diagram further illustrates an ion beam implantation system 80 in accordance with the present invention. In particular, FIG. 3 depicts an ion source 18 with a plurality of TIS systems 108a–108d for insulating a plurality of power supplies 102, 103 and 106 from a plurality of electrodes 94, 96, 98 and 100.

An ion chamber 82 is shown for containing a plasma 84, and an ignitor 86 for exciting the plasma 84. A container 88 for holding ionizable matter is connected to the ion chamber 82 via a conduit 92. The flow of ionizable matter from the container 88 to the ion chamber 82 is governed by a selectable valve 90. In addition, a set of electrodes including a plasma electrode 94, an extraction electrode 96, a suppression electrode 98, and a ground electrode 100 are shown.

The ignitor 86 is representative of electron sources or plasma initiators well known in the art, and the power output by the ignitor 86 is selectable. In particular, a controller 262 is coupled with the ignitor 86 by a power signal 114. The controller 262 directs the power output by the ignitor via a power signal 114, and the valve 90 governs the introduction of ionizable matter into the ion chamber 82. The controller 262 is coupled with and directs the valve 90 by flow signal 116. Thus, the controller directs the rate of flow of ionizable matter into the ion chamber by controlling the valve 90.

The controller 262 exercises control over the electrodes 94, 96, 98 and 100 via voltage control signals 118, 120 and 122. In particular, the plasma 84 exits the ion chamber 82 through a plasma electrode 94. An ion stream 68 is then directed and accelerated by an ion beam assembly 95 that includes the extraction electrode 96, the suppression electrode 98 and the ground electrode 100. The three variable voltage supplies 102, 104 and 106 regulate voltages between the electrodes 94, 96, 98 and 100. For instance, voltage supply 102 biases the voltage between the plasma electrode 94 and the extraction electrode 96, voltage supply 104 biases the voltage between the extraction electrode 96 and the suppression electrode 98, and voltage supply 106 biases the voltage between the suppression electrode 98 and the ground electrode 100. The voltage supplies 102, 104 and 106 are generally adjusted such that the electrodes 94, 96 and 98 are at a selected voltage relative to the ground electrode 100 as described above.

In accordance with the present invention, the TIS 108a, 108b, 108c and 108d (collectively referred to by reference number 108) are shown operatively coupled between the electrodes 94, 96, 98 and 100 and power supplies 102, 104 and 106 for providing power supply insulation from associated discharges that may occur between the electrodes (inter-electrode discharges) and/or between the electrodes and the system ground (not shown). The TIS 108 substantially improve ion beam performance by mitigating power supply overload conditions and thus mitigating ion beam losses typically associated with prior art systems.

Figure 4A:
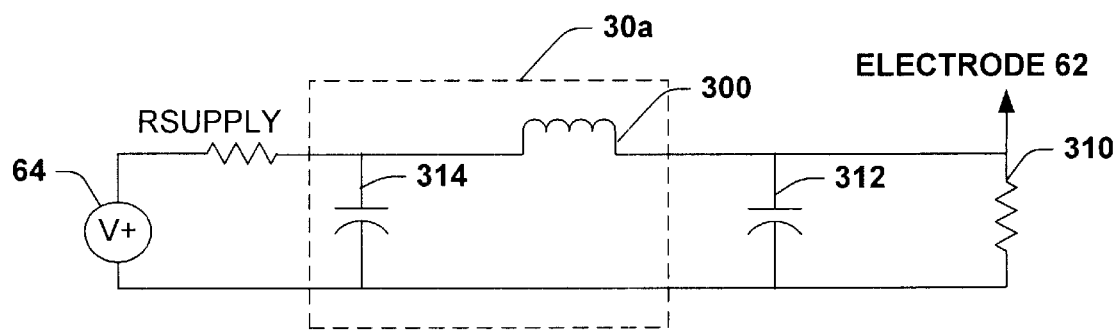
FIG. 4a is a schematic diagram of a passive circuit implementation of a transient isolation system in accordance with the present invention.

Now referring to FIG. 4a, a schematic diagram of one particular embodiment of a transient isolation system 30a in accordance with the present invention is shown. A series inductor 300 substantially insulates the power supply 64 from discharges occurring at the electrode 62 by upholding the supply voltage and providing a substantially constant impedance during a fast shunt (e.g., short circuit caused by an arc) of the electrode 62. The arc is then substantially extinguished by the collapse of the electrode voltage, while supply voltage does not collapse, such that the period of beam loss is limited to approximately the RL time constant of the electrode 62 and inductor 300 circuit. As shown, the electrode 62 circuit includes a non-linear electrode resistance 310 and a stray capacitance 312. The series inductor 300 may range from a few microhenries to several dozen millihenries depending on the voltage levels of the power supply 64 and electrode circuit component values. It is to be appreciated that a substantially wide range of inductor values may be employed to carry out the present invention.

Preferably, a parallel filter capacitor 314, coupled to the series inductor 300, may also be included in the TIS 30a. The capacitor 314 facilitates conditioning of the electrode 62 and operates as a $2^{nd}$ order low pass filter with the inductor 300. As described above with regards to the series inductor 300, a substantial range of capacitance values may be employed to carry out the present invention. The capacitance values may range from a few picofarads to several dozen microfarads.

For example, assuming a power supply resistance 318 of about 4 kΩ, an arc impedance (e.g., combination of electrode resistance 310 and stray capacitance 312) of about 1 kΩ, and a 90 kV extraction electrode voltage, a 10 mH inductor value may be selected to insulate the power supply 64 for about 10 microseconds. Given that the stray capacitance 310 value may be about 600 pF with a charging impedance of about 4 kΩ, a current of about 20 A may flow to replenish a charge on the stray capacitance 310 when an arc short circuits the electrode 62 (20 A≅90 kV/4 k ohms).

This charge (90 kV*600 pf≅54 uC) may be provided by approximately a 0.06 uF filter capacitor 314 if the voltage on the filter capacitor is to be maintained at about 1% of 90 kV (0.06 uF≅54 uC/(90 kV*1%)). With the above given circuit values, a transient increase of the power supply current is maintained below the overload rating of the power supply 64 (e.g., 30% overload rating) with a power supply voltage variation of about 0.4%. Thus, effective insulation of the power supply 64 from electrode 62 transients may be achieved.

Figure 4B:
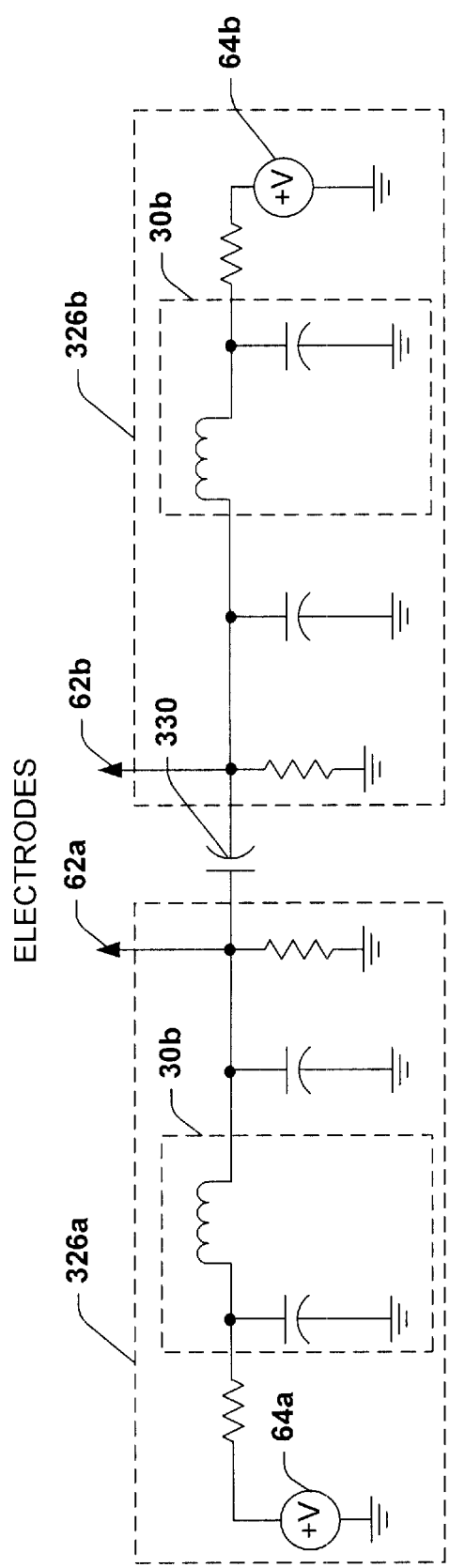
FIG. 4b is a schematic diagram of a passive circuit implementation of a transient isolation system for inter-electrode discharges in accordance with the present invention.

Referring now to FIG. 4b, another particular embodiment for power supply hardening is shown. It has been found that electrode breakdowns (collapses) are often initiated between electrodes. When electrodes are short circuited together, ion beam loss may also ensue, and the suppression voltage supply may also collapse. The circuit depicted in FIG. 4b provides power supply insulation from overload conditions when electrodes arc to each other.

A first electrode circuit 326a and a second electrode circuit 326b as depicted in FIG. 4a are shown coupled together via a capacitor 330 in FIG. 4b. By providing capacitive coupling between the electrode circuits 326a and 326b, individual electrode DC voltage control may be maintained because of the DC blocking characteristics of the capacitor 330. However, when short circuiting between electrodes 62a and 62b occur because of transient discharges between the electrodes, the discharge energy is supplied by the capacitor 330 rather than the power supplies 64a or 64b. A wide range of capacitance values may be chosen for the capacitor 330 depending on given circuit parameters. A 50 nF value may be sufficiently adequate in many applications. Additionally, the power supplies 64a and 64b are individually protected by the TIS 30b.

Figure 5A:
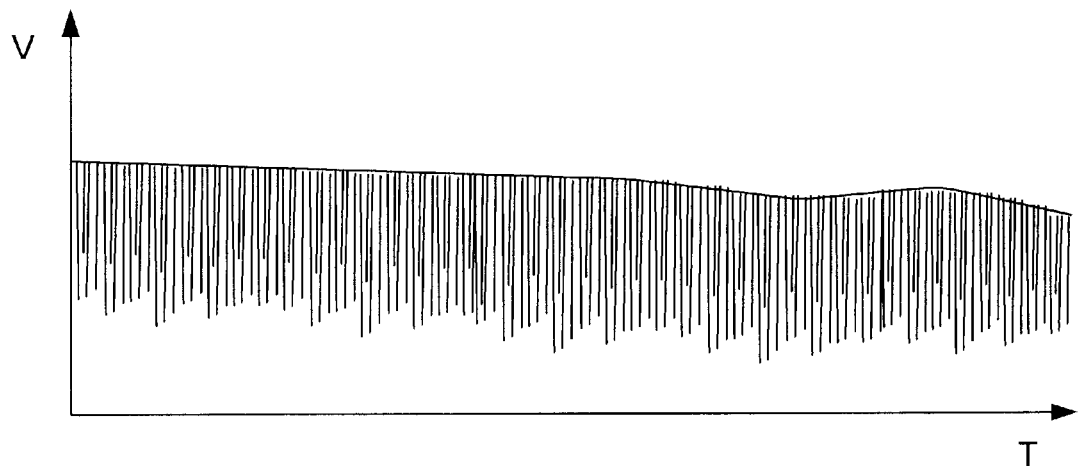
FIG. 5a is a transient voltage diagram before implementation of a passive transient isolation system in accordance with the present invention.
Figure 5B:
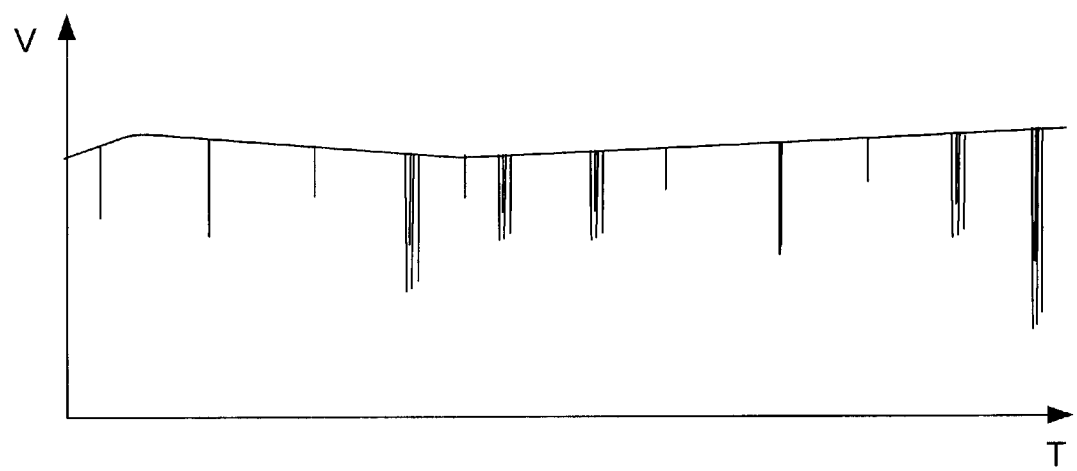
FIG. 5b is a transient voltage diagram after implementation of a passive transient isolation system in accordance with the present invention.

Referring now to FIGS. 5a and 5b, transient discharges (glitches) are depicted both before and after the TIS 30b (as shown in FIG. 4b) is installed. In FIG. 5a, a voltage glitch rate for a pair of suppression electrodes of about 1 glitch in about every 5–10 seconds is shown. In FIG. 5b, a glitch rate of about 1 glitch in about every 50–100 seconds is depicted after the TIS 30b is provided to isolate two suppression electrodes as depicted in FIG. 4b. The remaining glitches that are shown in FIG. 5b are generally related to non-suppressed extraction electrode glitches. A capacitor of about 50 nF is employed to couple the electrode circuits together as described above.

The passive circuits described above for the TIS 30 are effective for a given discharge energy and thus, for particular voltage ranges. At very high voltages, (>90 kV), the flux requirement on the filtering inductor 300 demands a large ferrite core volume. Therefore, an active circuit may be employed as another particular embodiment for the TIS 30.

Figure 6A:
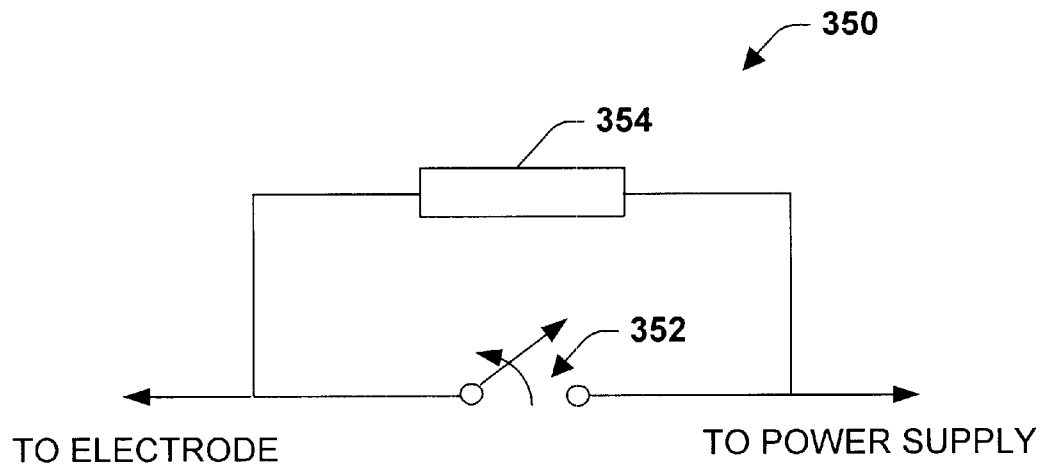
FIG. 6a is a schematic block diagram of an active circuit implementation of a transient isolation system in accordance with the present invention.

Turning now to FIG. 6a, a block diagram illustrating an active circuit 350 implementation of the TIS 30 is shown. The circuit 350 fulfills the same tasks as the passive circuits described above—insulate the power supply during a transient electrode voltage collapse, and maintain a substantially controlled electrode voltage to enable extinction of the discharge. The active circuit 350 operates on a wide voltage range and achieves good insulation performance.

Insulation of the power supply 64 from the electrode 62 may be accomplished by substantially eliminating the transient variation of the power supply load. A current-controlled and/or voltage-controlled switch 352 may be opened during a transient electrode collapse, thereby inserting a load 354 (e.g., resistor) matched to the nominal power supply operating impedance. The load 354 is shunted by the switch 352 during steady-state conditions, and inserted by opening the switch 352 during transient conditions. Generally, the switch 352 should provide a sub-microsecond switching time, 10–90 kV stand-off capability (depending on the electrode), tens of mA average and tens of amps pulsed current transfer capability, and preferably, a low forward voltage drop.

Figure 6B:
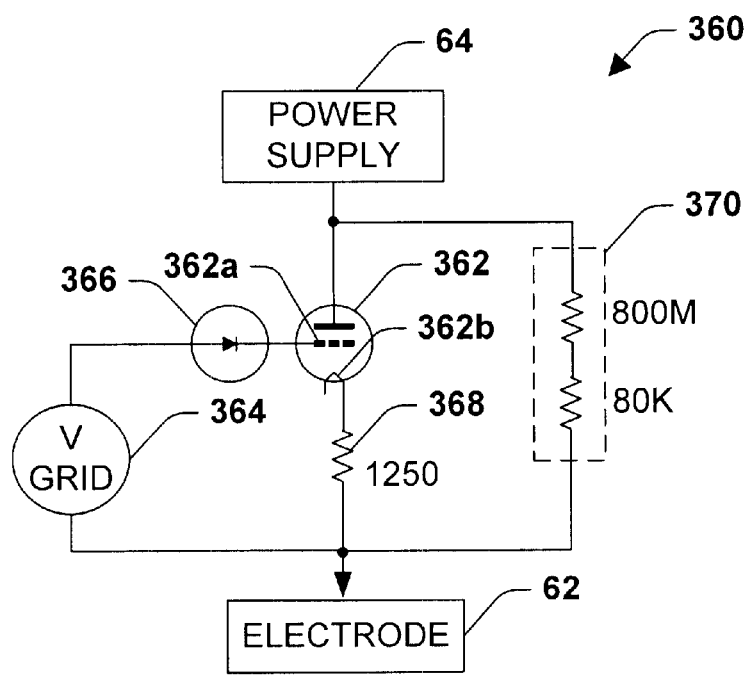
FIG. 6b is a detailed schematic block diagram of an active circuit implementation of a transient isolation system in accordance with the present invention.

Now referring to FIG. 6b, one particular embodiment of an active circuit 360 of the TIS 30 is shown. The circuit 360 includes a triode switch 362 (e.g., Eimac Y-810 planar triode) for insulating the power supply 64 during transient discharge conditions. It is to be appreciated that any suitable switch 362 may be employed to carry out the present invention. For example, tetrodes, pentodes, power MOSFET's, thyristors and power transistors may also be employed.

A grid bias power supply 364 is coupled to a grid 362a via a diode 366. The grid bias supply 366 is set to a voltage to hold the switch 362 on during normal (non-transient conditions) operation of the ion implantation system 10. The diode 366 is provided to isolate transients from the grid bias power supply 364.

A small (e.g., 1250 ohms) cathode sense resistor 368 is provided between a cathode 362b of the switch 362 and an electrode 62. As current rises in the cathode 362b circuit because of transient electrode discharges, the voltage on the cathode approaches the voltage set by the grid bias supply 364 for the grid 362a. If the current rises above a level predetermined by the cathode sense resistor 368, the switch 362 is opened until the transient current falls below the level that decreases the cathode 362b voltage below the grid 362a. When the switch 362 is opened, a load matching system 370 (e.g., approximately 800 Mohm resistor) is provided between the power supply 64 and the electrode 62. Thus, effective insulation of the power supply 64 is achieved from transient electrode discharges by inserting a load matching system 370 which substantially eliminates transients variations of the power supply load. The switch 362 is substantially transparent during normal (non-discharge) operations and provides a substantially similar power supply load during transient conditions.

Figure 7:
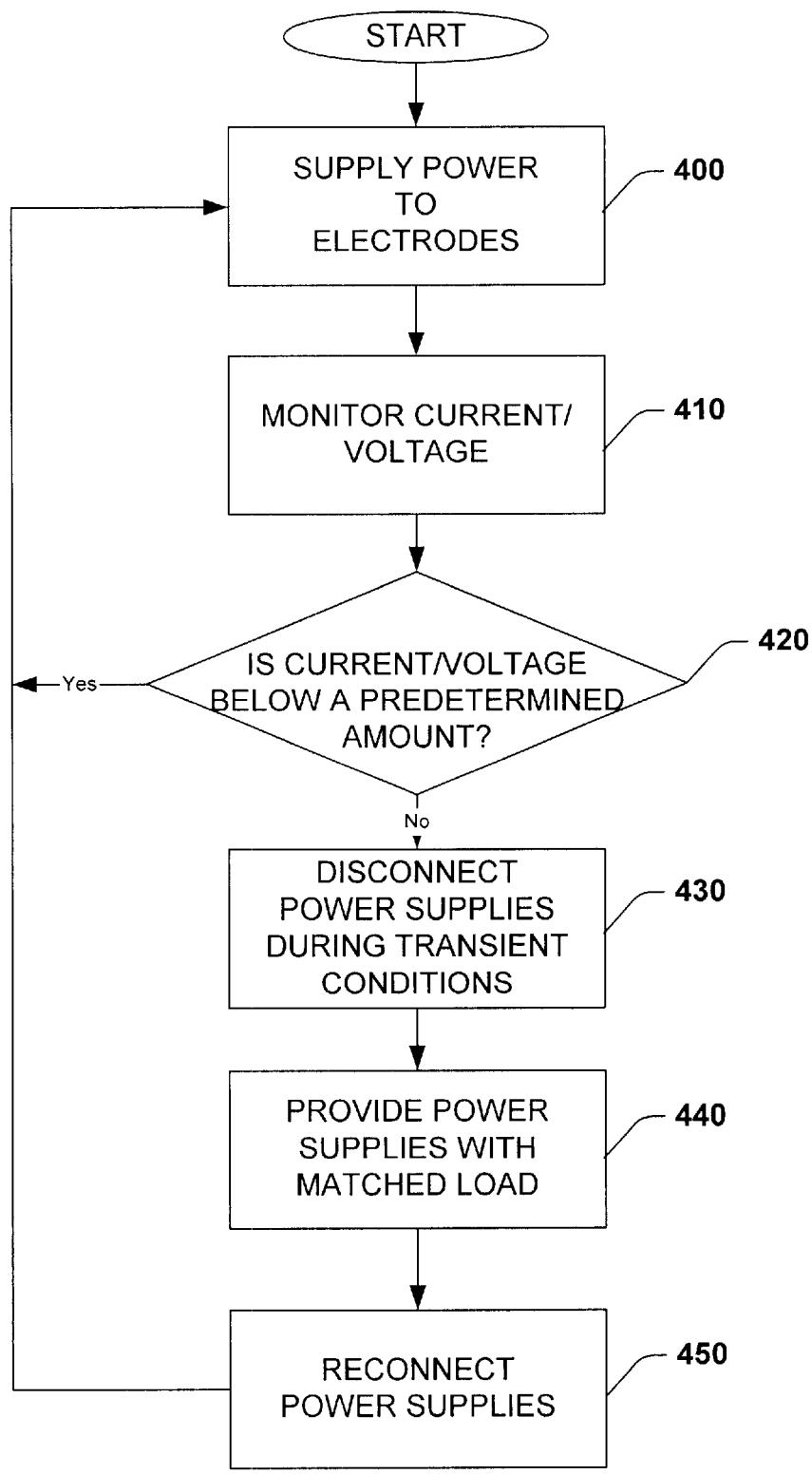
FIG. 7 is a flow diagram of a methodology for power supply hardening in accordance with the present invention.

Now referring to FIG. 7, a methodology for providing power supply hardening in an ion implantation system 10 in accordance with the present invention is shown. At step 400, electrode power supplies 64 are powered and maintained at voltage levels corresponding to the electrodes 62 of the system 10 (e.g., extraction electrode maintained at 90 kV). Proceeding to step 410, power supply current and/or voltage is monitored. The power supply current and/or voltage may be monitored by a current/voltage sense resistor, a Hall sensor, a magnetic sensor, or any suitable current/voltage sensing system. Proceeding to step 420, a determination is made as to whether steady-state current/voltage has risen above a predetermined level.

If the current/voltage level is below the predetermined threshold (e.g., 5% above nominal power supply operating current or voltage) at step 420, the process returns to step 400 and maintains the electrode voltages. If the current/voltage level is above the predetermined threshold at step 420, the process proceeds to step 430.

At step 430, the power supplies 64 are disconnected from the electrodes during transient discharge conditions. The power supplies may be disconnected via active and/or passive circuits as described above. Proceeding to step 440, the process inserts a load matching system which is matched to the steady-state load of the power supplies. The load matching system insulates the power supplies from transient discharges by substantially eliminating power supply load variations. The load matching system may be any suitable load matching circuit such as a resistor, impedance network, active network, etc. After the transient condition has subsided, the process proceeds to step 450 whereby the power supplies 64 are reconnected to the electrodes 62. The process then returns to step 400 and maintains the electrodes 62 at steady-state voltage.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An ion implantation system, comprising:
    a first electrode and a second electrode;
    a first power supply and a second power supply operably coupled to the first and second electrodes, respectively;
    a switching system operatively coupled between the first power supply and the first electrode, the switching system decoupling the first power supply and the first electrode at a predetermined threshold to mitigate overload of the first power supply; and
    a capacitor coupled between the first electrode and the second electrode to mitigate overloading of the first and second power supplies during a transient discharge between the first and second electrodes.

2. The ion implantation system of claim 1, the switching system further includes a passive circuit for decoupling the at least one power supply from the at least one electrode.

3. The ion implantation system of claim 1, the switching system further includes an active circuit for decoupling the at least one power supply from the at least one electrode.

4. An ion implantation system, comprising:
    an ion source for providing ions to form an ion beam;
    a first electrode and a second electrode;
    a first power supply and a second power supply operably coupled to the first and second electrodes, respectively, the first and second power supplies operable to provide voltage to the first and second electrodes, respectively for directing the ion beam to a workpiece;
    a transient isolation system for providing ion beam to the workpiece in a substantially uninterrupted manner, the transient isolation system insulating at least one of the power supplies from discharges at the electrode associated with the at least one power supply; and
    a capacitor, wherein the capacitor couples the first electrode with the second electrode to mitigate overloading of the first and second power supplies.

5. The ion implantation system of claim 4, the transient isolation system further including a passive circuit for insulating the at least one power supply from discharges by the at least one electrode.

6. The transient isolation system of claim 5, the passive circuit further including an inductor.

7. The transient isolation system of claim 5, the passive circuit further including a capacitor.

8. The ion implantation system of claim 4, the transient isolation system further including an active circuit for insulating the at least one power supply from discharges by the at least one electrode.

9. The transient isolation system of claim 8, the active circuit including an active switch for temporarily disconnecting the at least one power supply from transient discharges by the at least one electrode.

10. The transient isolation system of claim 9, the active switch comprising at least one of: a triode, a pentode, a tetrode, a MOSFET, a thyristor, and a power transistor.

11. The transient isolation system of claim 8, the active circuit including a load matching system for mitigating load variations of the at least one power supply from transient discharges by the at least one electrode.

12. The transient isolation system of claim 11, the load matching system including at least one of: a resistor, an impedance network, and an active network.

13. The transient isolation system of claim 9, the active circuit including a sensor for activating the active switch.

14. The transient isolation system of claim 12, the sensor including at least one of: a resistor, a Hall sensor, and magnetic sensor.

15. The ion implantation system of claim 4, the transient isolation system being included within the at least one power supply.

16. The ion implantation system of claim 4, the transient isolation system being included with the at least one electrode.

17. An ion implantation system, comprising:
    a voltage source for providing voltage to at least one electrode; and
    means for decoupling the voltage source and the at least one electrode at a predetermined threshold to mitigate overload of the voltage source.

18. A method for power supply hardening in an ion implantation system, comprising the steps of:
    monitoring current from at least one power supply which powers at least one electrode;
    determining if the current is below a predetermined threshold; and
    insulating the at least one power supply from the at least one electrode if the current is above the predetermined threshold, wherein insulating comprises inserting a load matching system between the at least one power supply and the at least one electrode if the current is above the predetermined threshold.

19. A method for power supply hardening in an ion implantation system, comprising the steps of:
    monitoring voltage from at least one power supply which powers at least one electrode;
    determining if the voltage is below a predetermined threshold; and
    insulating the at least one power supply from the at least one electrode if the voltage is above the predetermined threshold.

20. The method of claim 19 further including the step of inserting a load matching system between the at least one power supply and the at least one electrode if the voltage is above the predetermined threshold.

21. An ion implantation system, comprising:

at least one electrode;

at least one power supply for providing voltage to the at least one electrode;

a switching system operatively coupled between the at least one power supply and the at least one electrode; and a load matching system coupled to the switching system, wherein the switching system inserts the load matching system between the at least one electrode and the at least one power supply upon detection of a transient condition at the electrode.

22. An ion implantation system, comprising:

an ion source for providing ions to form an ion beam;

a first electrode and a second electrode;

a first power supply and a second power supply for providing voltage to the first electrode and the second electrode, respectively;

a switching system operatively coupled between the first power supply and the first electrode;

a load matching system coupled to the switching system, wherein the switching system inserts the load matching system between the first electrode and the first power supply upon detection of a transient condition at the first electrode;

a capacitor coupled to the first and second electrodes, wherein the capacitor mitigates overloading the first and second power supplies upon detection of a transient condition between the first and second electrodes.

\* \* \* \* \*